(12) United States Patent
Murphy et al.

(10) Patent No.: US 8,638,173 B2
(45) Date of Patent: Jan. 28, 2014

(54) SYSTEM AND METHOD OF CALIBRATING A PHASE-LOCKED LOOP WHILE MAINTAINING LOCK

(75) Inventors: Glenn A. Murphy, San Diego, CA (US); Xiaohua Kong, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 13/296,389

(22) Filed: Nov. 15, 2011

(65) Prior Publication Data
US 2013/0120072 A1 May 16, 2013

(51) Int. Cl.
*H03L 7/00* (2006.01)

(52) U.S. Cl.
USPC ............... 331/17; 331/16; 331/182; 331/183

(58) Field of Classification Search
USPC ...... 331/15–17, 57, 117 R, 117 FE, 167, 182, 331/183
See application file for complete search history.

(56) References Cited

U.S. PATENT DOCUMENTS

| 6,064,947 | A | 5/2000 | Sun et al. |
| 6,275,115 | B1 | 8/2001 | Egawa |
| 6,552,618 | B2 | 4/2003 | Nelson et al. |
| 6,856,204 | B2 | 2/2005 | Kwon |
| 6,949,981 | B2 | 9/2005 | Natonio et al. |
| 7,148,758 | B1 * | 12/2006 | Ross et al. ................ 331/17 |
| 7,969,248 | B1 * | 6/2011 | Whitten et al. ............ 331/16 |
| 2002/0079973 | A1 | 6/2002 | Higashi et al. |
| 2010/0090768 | A1 * | 4/2010 | Yamazaki ................... 331/15 |
| 2011/0316639 | A1 * | 12/2011 | Fischette ................... 331/183 |

FOREIGN PATENT DOCUMENTS

WO 2009118587 A1 10/2009

OTHER PUBLICATIONS

Nonis, Roberto et al. "Modeling, Design and Characterization of a New Low Jitter Analog Dual Tuning LC-VCO PLL Architecture," IEEE International Symposium on Circuits and Systems, 2004, pp. 553-556.
International Search Report and Written Opinion—PCT/US2012/065362—ISA/EPO—Sep. 27, 2013.

* cited by examiner

*Primary Examiner* — Joseph Chang
*Assistant Examiner* — Jeffrey Shin
(74) *Attorney, Agent, or Firm* — Sam Talpalatsky; Nicholas J. Pauley; Joseph Agusta (57) ABSTRACT

A method of calibrating a phase-locked loop (PLL) while maintaining lock includes detecting that a control signal to an oscillator in a PLL has exceeded a threshold value while the PLL is locked to an input signal. In response, an operating current of the oscillator is adjusted to return the control signal below the threshold value while maintaining lock of the PLL to the input signal. Adjusting the operating current includes slowly varying an output current of a calibration circuit coupled to the PLL, enabling the PLL to maintain lock to the input signal during adjustment of the operating current.

20 Claims, 9 Drawing Sheets

SYSTEM AND METHOD OF CALIBRATING A PHASE-LOCKED LOOP WHILE MAINTAINING LOCK

I. FIELD

The present disclosure is generally related to calibration of phase-locked loops.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may include control systems such as phase-locked loops (PLLs) that generate an output signal whose phase, frequency, or both is "locked" to an input signal (e.g., a clock signal). For example, the phase-locked output signal may have the same or a multiple of the frequency of the input signal and may be provided as a control signal to other components within a wireless telephone. However, the PLL may be sensitive to process, voltage, and temperature variations. For example, the PLL may "lose lock" with respect to the input signal when process, temperature, or voltage variations occur within the PLL, thereby introducing jitter into the output signal.

III. SUMMARY

To compensate for minor process, voltage, and temperature changes, the components of a PLL may be selected or designed to withstand such changes without performance degradation (e.g., as design margins). Thus, the PLL may be said to have a preferred temperature and voltage operating range. In addition, the PLL may be subjected to an initial calibration upon power-up (e.g., to "center" the PLL within the operating range). During initial calibration, the PLL may be configured for performance based on a power-up voltage and an initial temperature. However, during operation of the PLL, temperature or voltage changes may occur that shift the PLL outside the operating range, resulting in performance degradation at the PLL. For example, the temperature of components within the PLL may begin to rise as the PLL continues to operate. The rise in temperature may result in the PLL losing lock with an input signal and introducing jitter into an output signal of the PLL. Moreover, recalibrating the PLL using initial calibration methods may cause the PLL to lose lock with the input signal, resulting in a waiting period while the recalibrated PLL attempts to reacquire lock to the input signal.

Systems and methods of calibrating a PLL without losing lock at the PLL are disclosed. For example, a control signal of the PLL may exceed a threshold value, indicating that the PLL has undergone a voltage or temperature fluctuation above a threshold. In response, an amount of current supplied by a calibration circuit to an oscillator of the PLL may be modified to counteract the temperature or voltage fluctuation. The amount of current may be slowly varied, thereby enabling the control signal to return below the threshold value without losing lock at the PLL. Thus, the systems and methods disclosed herein may enable the PLL to maintain lock and operate at a higher or lower voltage or temperature than during the initial power-up stage.

In a particular embodiment, a method includes detecting that a control signal to an oscillator in a phase-locked loop (PLL) has exceeded a threshold value while the PLL is locked to an input signal. The method includes, in response to the detecting, adjusting an operating current of the oscillator to return the control signal below the threshold value while maintaining lock of the PLL to the input signal. Adjusting the operating current includes slowly varying an output current of a calibration circuit coupled to the PLL to enable the PLL to maintain lock to the input signal during adjustment of the operating current.

In another particular embodiment, the oscillator is a voltage-controlled oscillator (VCO) and the control signal is a tuning voltage generated by a charge pump of the PLL. In a particular embodiment, the threshold value can be an upper or lower threshold of the PLL.

In another particular embodiment, an apparatus includes a PLL that has an oscillator. The apparatus also includes a calibration circuit configured to slowly vary an output current supplied to the PLL in response to a determination that a control signal to the oscillator has exceeded a threshold value. Slowly varying the output current adjusts the operating current of the oscillator to return the control signal below the threshold value. Slowly varying the output current also enables the PLL to maintain lock to an input signal during adjustment of the operating current.

One particular advantage provided by at least one of the disclosed embodiments is an ability to perform post-lock calibration of a PLL without losing lock to an input signal. Other aspects, advantages, and features of the present disclosure will become apparent after review of the entire application, including the following sections: Brief Description of the Drawings, Detailed Description, and the Claims.

V. DETAILED DESCRIPTION

Figure 1:
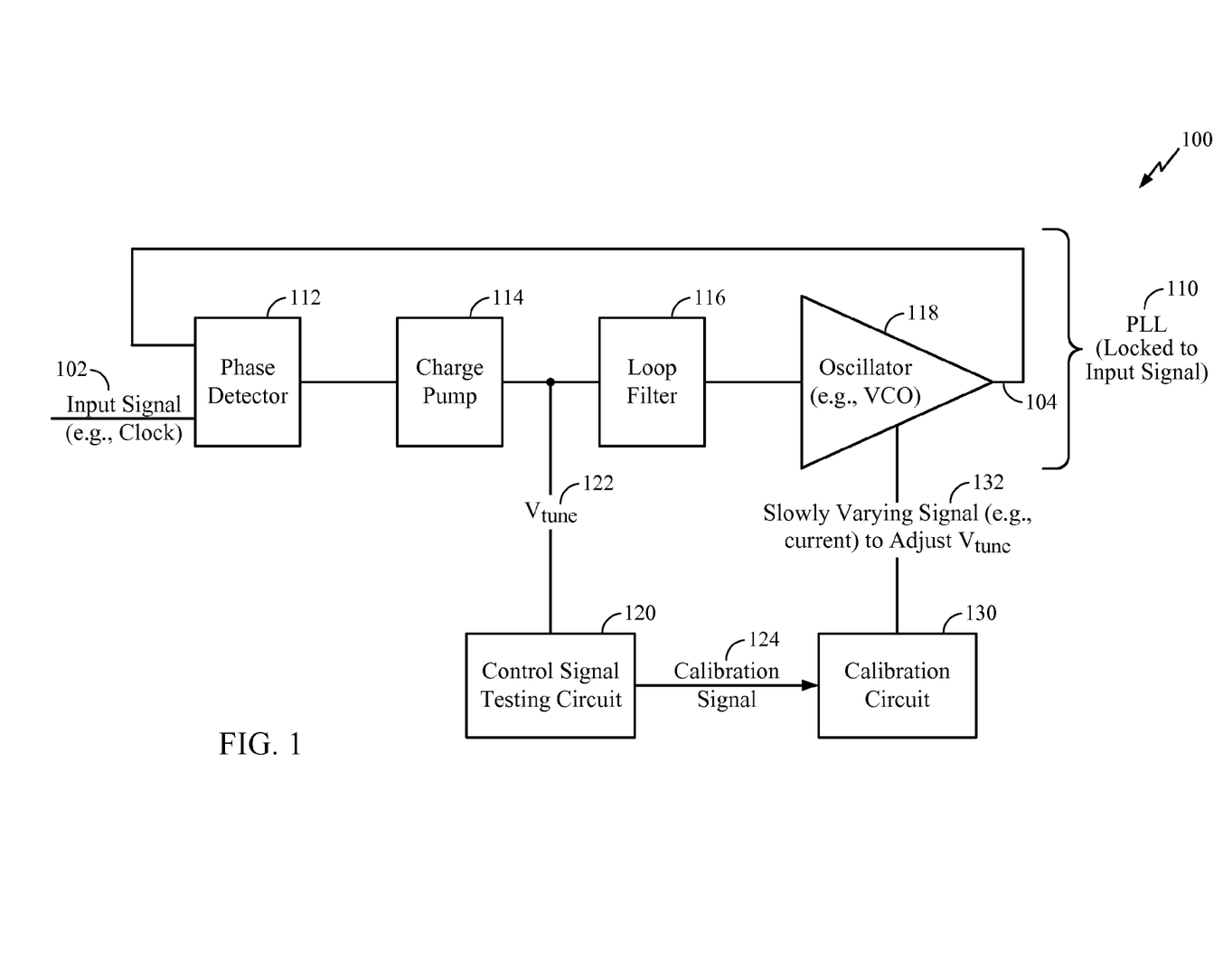
FIG. 1 is a block diagram of a particular illustrative embodiment of a system of calibrating a PLL while maintaining lock.

Referring to FIG. 1, a particular illustrative embodiment of a system of calibrating a phase-locked loop (PLL) while maintaining lock is disclosed and generally designated 100. The system 100 includes a PLL 110 coupled to a control signal testing circuit 120 and to a calibration circuit 130.

The PLL 110 may receive an input signal 102 and may produce an output signal 104. For example, the input signal 102 may be a clock signal (e.g., having a frequency of 100 Hz). When locked to the input signal 102, the output signal 104 produced by the PLL 110 may have the same frequency as the input signal 102 (e.g., 100 Hz) or may have a multiple of the frequency of the input signal 102 (e.g., 200 Hz, 500 Hz, 10 MHz, 1 GHz, etc.).

The PLL 110 may include a phase detector 112, a charge pump 114, a loop filter 116 (e.g., a low-pass filter), and an oscillator 118 (e.g., a voltage-controlled oscillator (VCO)). When the frequency of the output signal 104 is a multiple of the frequency of the input signal 102, the PLL 110 may further include a feedback divider (not shown) between the output signal 104 and the phase detector 112. The phase detector 112 may detect phase mismatches between the input signal 102 and the output signal 104, which is fed back from the oscillator 118. An output of the phase detector 112 may be provided to the charge pump 114 that includes one or more capacitors. The output of the charge pump 114 may represent a control signal of the PLL 110 and may be provided to the loop filter 116. For example, the control signal may represent a tuning voltage ($V_{tune}$) 122 of the PLL 110. Based on the output of the loop filter 116, the oscillator 118 may adjust the frequency of the output signal 104 to lock with the input signal 102. The output signal 104 of the oscillator 118 may also be fed back into the phase detector 112, thereby implementing a negative feedback loop at the PLL 110.

The control signal testing circuit 120 may be configured to detect when the tuning voltage $V_{tune}$ 122 exceeds a threshold value (or alternatively, is below a second threshold value). To illustrate, the PLL 110 may be associated with a preferred operating range of $0.3V < V_{tune} < 1.1V$. For example, the PLL 110 and components thereof may be configured to withstand process, voltage, and temperature variations that result in a value of $V_{tune}$ 122 between 0.3V and 1.1V. However, performance of the PLL 110 may degrade when $V_{tune}$ 122 is lower than 0.3V or higher than 1.1V, resulting in frequency jitter in the output signal 104. The control signal testing circuit 120 may thus detect when $V_{tune}$ 122 is approaching or has exceeded (or gone below) the preferred operating range. For example, the control signal testing circuit 120 may detect when $V_{tune}$ 122 becomes less than a lower threshold (e.g., 0.35V) or greater than an upper threshold (e.g., 1.05V). When $V_{tune}$ crosses either threshold, the control signal testing circuit 120 may provide a calibration signal 124 to the calibration circuit 130. Illustrative components of the control signal testing circuit 120 are further described with reference to FIG. 2.

The calibration circuit 130 may be configured to provide a slowly varying signal 132 to adjust $V_{tune}$ 122 in a manner such that the PLL 110 maintains lock. For example, the slowly varying signal may be a slowly varying current provided to the oscillator 118. Gradual injection or removal of current at the oscillator 118 of the PLL 110 may result in a change in $V_{tune}$ 122 with little or no corresponding change in the frequency of the output signal 104, thereby returning $V_{tune}$ 122 to the preferred operating range without causing the PLL 110 to lose lock. For example, the oscillator 118 may have a high pass noise transfer function, and the low frequency (i.e., slowly varying) signal 132 may compensate for the temperature or voltage variation at the PLL 110. An illustrative embodiment of the calibration circuit 130 is further described with reference to FIG. 3.

During operation, the PLL 110 may achieve lock with respect to the input signal 102. As the PLL 110 continues to operate, one or both of the internal voltage and temperature of the PLL 110 and components thereof may fluctuate. To illustrate, a temperature fluctuation may result in $V_{tune}$ 122 rising by 0.5V, causing 100 μA of additional current at the PLL 110. To counteract this increase in $V_{tune}$ 122, the calibration circuit 130 may slowly inject 100 μA of current into the oscillator 118, which adjusts feedback to the charge pump 114 and restores $V_{tune}$ 122 to its original value without losing lock between the output signal 104 and the input signal 102. An illustrative embodiment of decreasing $V_{tune}$ 122 without losing PLL lock is further described with reference to FIG. 4. An illustrative embodiment of increasing $V_{tune}$ 122 without losing PLL lock is further described with reference to FIG. 5.

The system 100 of FIG. 1 may thus enable post-lock calibration or adjustment of the PLL 110 without losing lock. The ability to calibrate the PLL 110 during operation without losing lock may result in a more robust control system for use in electronic devices such as wireless telephones. In addition, since other components that rely on the PLL do not need to wait while the PLL re-acquires lock after a subsequent calibration, the system 100 of FIG. 1 may enable more efficient performance at electronic devices.

Figure 2:
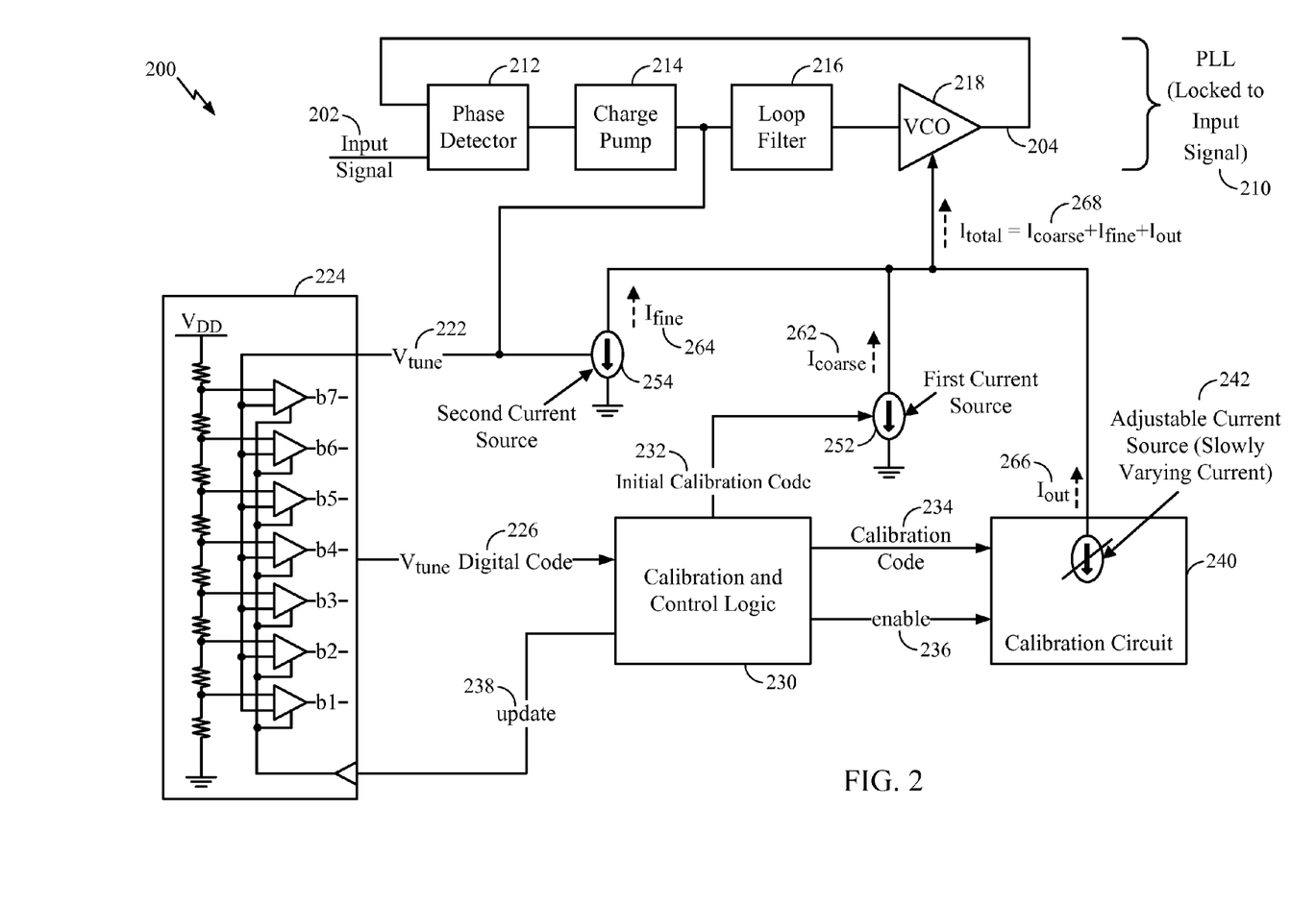
FIG. 2 is a diagram of another particular illustrative embodiment of a system of calibrating a PLL while maintaining lock.

Referring to FIG. 2, another particular illustrative embodiment of a system of calibrating a PLL while the PLL maintains lock is disclosed and generally designated 200. The system 200 includes a PLL 210, where the PLL 210 includes a phase detector 212, a charge pump 214, a loop filter 216, and a voltage-controlled oscillator (VCO) 218. The PLL 210 is operable to achieve lock between an input signal 202 and an output signal 204. In an illustrative embodiment, the PLL 210 and components thereof may operate as described with reference to the PLL 110 of FIG. 1 and components thereof For example, the charge pump 214 may produce a control signal $V_{tune}$ 222, as described with reference to the charge pump 114 and $V_{tune}$ 122 of FIG. 1. Further, the VCO 218 may be coupled to a slowly varying signal to adjust $V_{tune}$ 222, as described with reference to the oscillator 118 of FIG. 1.

In a particular embodiment, the VCO 218 may be coupled to a first current source 252, a second current source 254, and an adjustable current source 242 of a calibration circuit 240. The first current source 252 may provide a coarse calibration current $I_{coarse}$ 262 to the PLL 210, the second current source 254 may provide a fine calibration current $I_{fine}$ 264 to the PLL 210, and the adjustable current source 242 may provide an output current $I_{out}$ 266 to the PLL 210. A total current $I_{total}$ 268 provided to the PLL 210 may be equal to a sum of $I_{coarse}$ 262, $I_{fine}$ 264, and $I_{out}$ 266. In a particular embodiment, $I_{total}$ 268 represents an operating current of the PLL 210. It should be noted that the directions of the currents 262-268 in FIG. 2 are for illustrative purposes only.

The system 200 may also include calibration and control logic 230. The calibration and control logic 230 may implement pre-lock (e.g., initial) calibration of the PLL 210 as well as post-lock calibration of the PLL 210. For example, the calibration and control logic 230 may control the first current source 252 and the second current source 254 during initial calibration of the PLL 210. Upon power-up at the system 200, the calibration and control logic 230 may send a calibration code 232 (e.g., an initial calibration signal) to the first current source 252. Responsive to the calibration code 232, the first current source 252 may provide $I_{coarse}$ 262 to the PLL 210 as an initial calibration current, where the magnitude of $I_{coarse}$ 262 is based on the value of the calibration code 232. The initial calibration current may enable the PLL 210 to lock to the input signal 202 at a value of $V_{tune}$ 222 that is less than an upper threshold of the PLL 210 and greater than a lower threshold of the PLL 210. In an illustrative embodiment, the calibration code 232 may be a 6-bit digital code. In a particular embodiment, the second current source 254 may provide $I_{fine}$ 264 as a tuning current to the PLL 210, where the magnitude of $I_{fine}$ 264 is based on the value of $V_{tune}$ 222. In a particular embodiment, one or both of the currents $I_{coarse}$ 262 and $I_{fine}$ 264 may not be modified by the calibration and control logic 230 after the initial calibration of the PLL 210.

The system 200 may further include an analog-to-digital converter (ADC) 224 that receives $V_{tune}$ 222 as an input. The ADC 224 may convert $V_{tune}$ 222 to a digital value (e.g., a digital code 226) and provide the digital value to the calibration and control logic 230. To illustrate, the digital code 226 may have one of seven values (illustrated as "b1" through "b7" in FIG. 2). In a particular embodiment, the ADC 224 may be selectively enabled and disabled based on an update signal 238 provided by the calibration and control logic 230.

The calibration and control logic 230 may compare the digital code 226 to a threshold value. When the digital code 226 indicates that $V_{tune}$ 222 has exceeded the threshold value (or gone below a lower threshold value), the calibration and control logic 230 may send a calibration code 234 and an enable signal 236 to the calibration circuit 240. For example, the calibration code 234 may be a 4-bit digital code representing a magnitude of current that is based on the value of the digital code 226. The calibration circuit 240 may slowly vary $I_{out}$ 266 produced by the adjustable current source 242 to a new value corresponding to the calibration code 234. An illustrative embodiment of the calibration circuit 240 is further described with reference to FIG. 3.

In operation, the calibration and control logic 230 may perform initial calibration of the PLL 210 by use of the first current source 252 and the second current source 254. After the initial calibration, the PLL 210 may achieve lock between the output signal 204 and the input signal 202. The ADC 224 may convert $V_{tune}$ 222 to the digital code 226 and the calibration and control logic 230 may determine whether $V_{tune}$ 222 has exceeded a threshold (e.g., due to a fluctuation in voltage, temperature, or both at the PLL 210). When $V_{tune}$ has exceeded the threshold, the calibration and control logic 230 may transmit a calibration code 234 to the calibration circuit 240, where the calibration code 234 represents a magnitude of current to be injected or removed at the PLL 210 to counteract the change in $V_{tune}$ 222. The calibration circuit 240 may slowly vary $I_{out}$ 266 based on the calibration code 234, thereby returning $V_{tune}$ 222 to its original value or to another desired value without losing lock at the PLL.

The system 200 of FIG. 2 may thus enable low-power post-lock calibration of the PLL 210 without losing lock. In addition, the ADC 224 that translates $V_{tune}$ 222 into a digital value may enable the system 200 of FIG. 2 to perform spread-spectrum signal generation at the PLL 210 when incorporated into digital systems. Such spread-spectrum signal generation may be useful in digital receivers in wireless communication devices.

Figure 3:
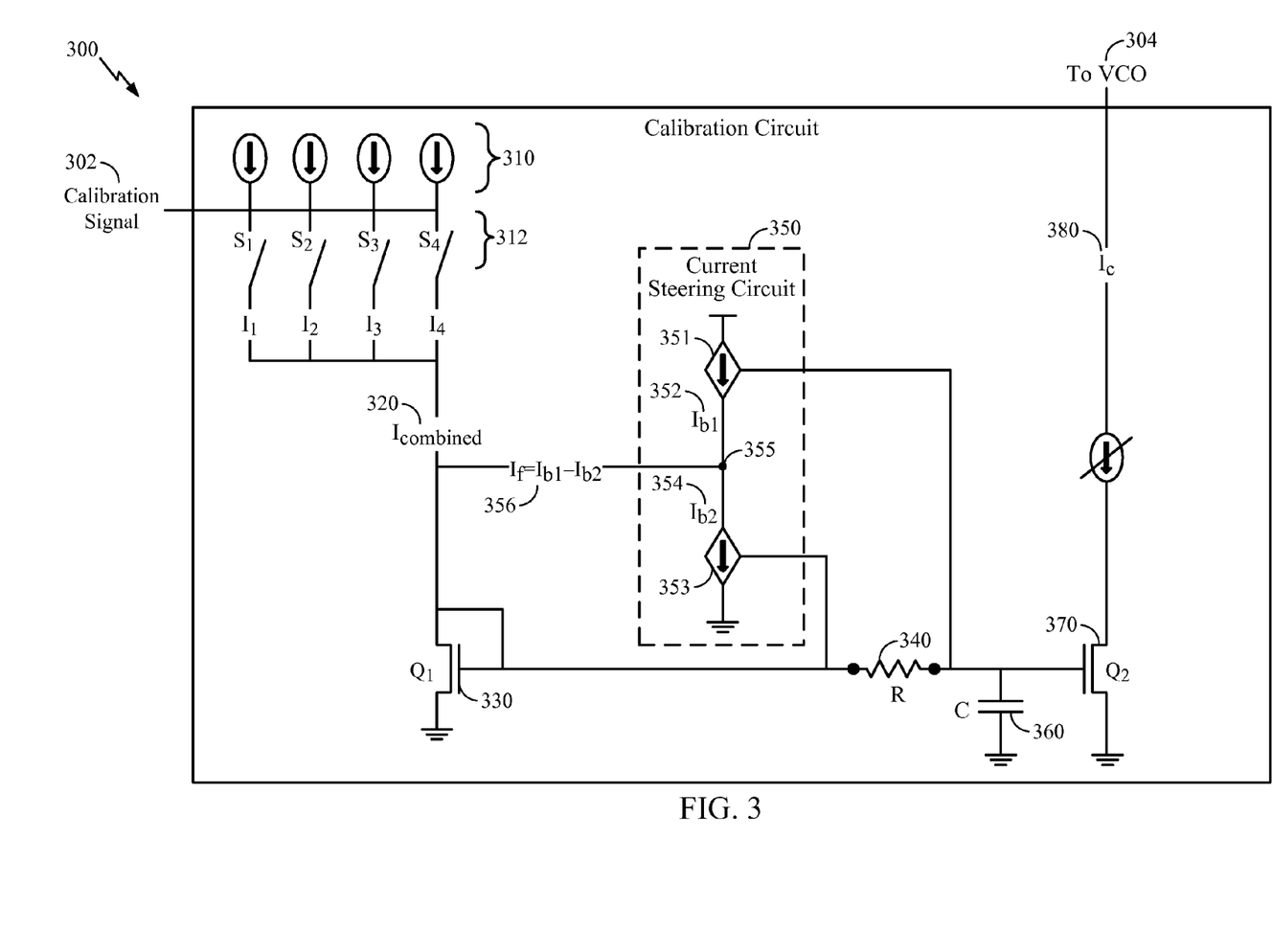
FIG. 3 is a diagram of a particular illustrative embodiment of a calibration circuit of FIG. 1 or FIG. 2.

Referring to FIG. 3, a particular illustrative embodiment of the calibration circuit 130 of FIG. 1 or the calibration circuit 240 of FIG. 2 is disclosed and generally designated 300.

The calibration circuit 300 receives a calibration signal 302 as an input and produces an output signal 304 at an output. For example, the calibration signal 302 may be the calibration signal 124 of FIG. 1 or the calibration code 234 of FIG. 2, and the output signal 304 may be coupled to the oscillator 118 of FIG. 1 or the VCO 218 of FIG. 2.

The calibration circuit 300 may include one or more current sources 310 coupled to one or more corresponding switches 312. In a particular embodiment, each of the current sources 310 is configured to generate a different amount of current. Alternately, one or more of the current sources 310 may generate the same amount of current. The switches 312 may be opened or closed based on a value of the calibration signal 302. For example, the calibration signal 302 may be a 4-bit digital code, where the value of each particular bit represents whether a corresponding particular switch should be opened or closed. A sum of the currents passed through by closed switches may form a combined current $I_{combined}$ 320. For example, the four current sources 310 may produce currents of 5 μA, 10 μA, 20 μA, and 40 μA, respectively, enabling $I_{combined}$ 320 to be any multiple of 5 μA between 0 μA and 75 μA.

The combined current $I_{combined}$ 320 may represent an input current applied to a gate of a first transistor $Q_1$ 330. The gate of the first transistor $Q_1$ 330 may be coupled to a gate of a second transistor $Q_2$ 370 via a resistive element R 340 (e.g., a resistor). A capacitor C 360 may also be included, as illustrated in FIG. 3.

The terminals of the resistive element R 340 may be coupled to a current steering circuit 350. The current steering circuit 350 may generate a feedback current $I_f$ 356 to at least partially offset the input current $I_{combined}$ 320 based on a voltage difference across the resistive element 340, thereby throttling a voltage applied at the gate of the second transistor $Q_2$ 370. In a particular embodiment, the current steering circuit 350 includes a first current source 351 coupled to a second current source 353 via a node 355. The first current source 351 may be responsive to a first voltage at a first terminal of the resistive element R 340 to output a first current $I_{b1}$ 352 to the node 355. The second current source 353 may be responsive to a second voltage at a second terminal of the resistive element R 340 to output a second current $I_{b2}$ 354 to the node 355. The feedback current $I_f$ 356 may be equal to a difference between the first current $I_{b1}$ 352 and the second current $I_{b2}$ 354 (i.e., $I_f = I_{b1} - I_{b2}$). The feedback current $I_f$ 356 may thus act to control the voltage difference across the resistive element R 340 while the capacitor C 360 is charged and provide an input to the gate of the second transistor $Q_2$ 370 so that an output current $I_c$ 380 coupled to the second transistor $Q_2$ 370 that represents the output signal 304 is varied slowly.

During operation, the current steering circuit 350 may at least partially throttle the voltage applied at the gate of the second transistor $Q_2$ 370 so that $I_c$ 380 does not immediately become equal to $I_{combined}$ 320. For example, referring to the illustration of FIG. 3, if the voltage at the left-hand terminal of R 340 drops below the voltage at the right-hand terminal of R 340, $I_f$ 356 increases since $I_{b1}$ 352 becomes greater than $I_{b2}$ 354. The increase in $I_f$ 356 increases the voltage at the left-hand terminal of R 340. Conversely, if the voltage at the right-hand terminal of R 340 drops below the voltage at the left-hand terminal of R 340, $I_c$ 356 decreases since $I_{b1}$ 352 becomes less than $I_{b2}$ 354. Thus, the current steering circuit 350 may keep the voltage across the resistive element R 340 small, resulting in a gradual increase or decrease of $I_c$ 380 until $I_c$ 380 becomes equal to $I_{combined}$ 320.

Figure 4:
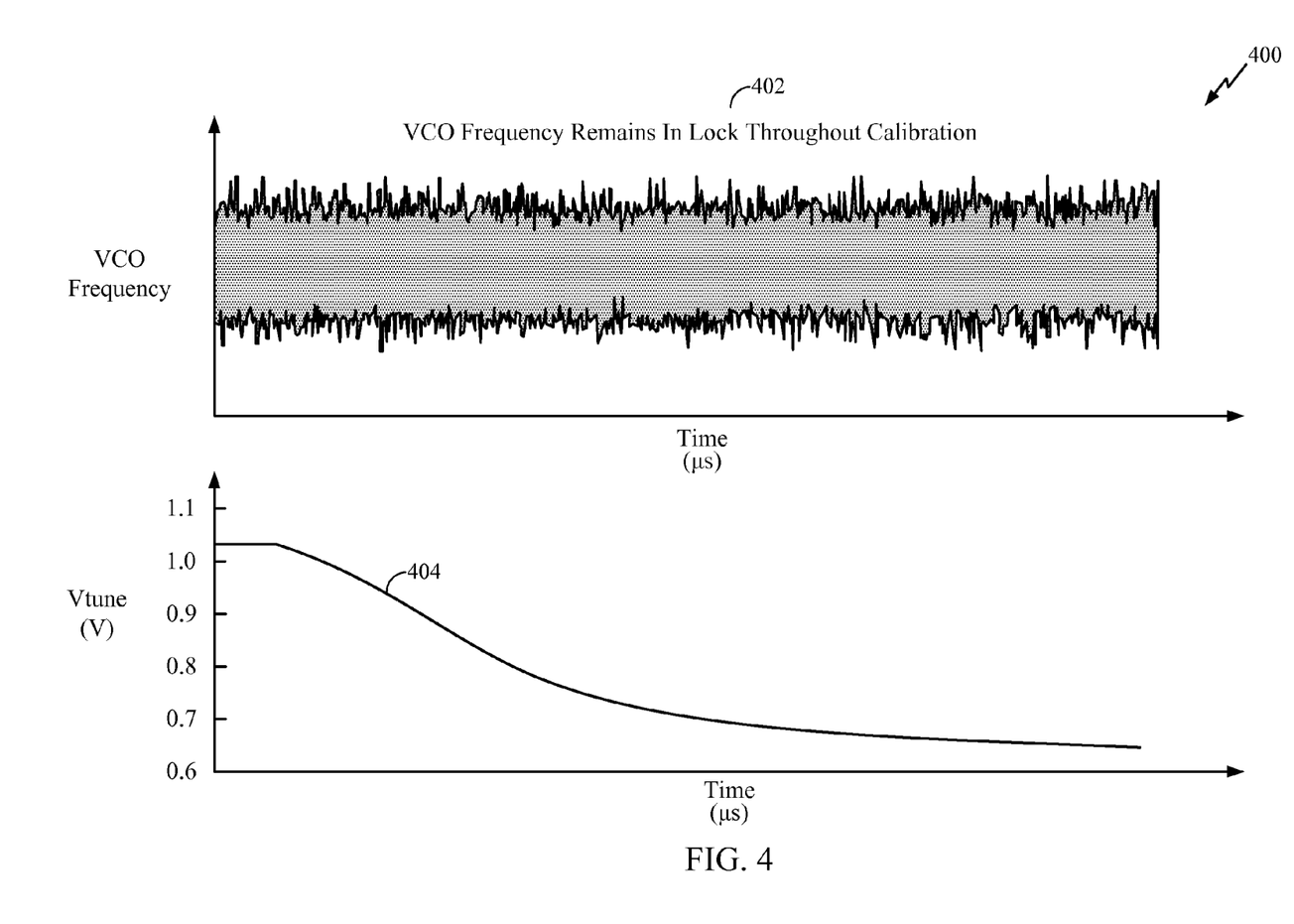
FIG. 4 is a diagram to illustrate a particular embodiment of decreasing a tuning voltage of a PLL of FIG. 1 or of FIG. 2 without losing lock.

Referring to FIG. 4, a particular embodiment of decreasing a tuning voltage of a PLL (e.g., the PLL 110 of FIG. 1 or the PLL 210 of FIG. 2) without losing lock is disclosed and generally designated 400.

For example, a charge pump of the PLL may produce a tuning signal $V_{tune}$, and the PLL may experience performance degradation when the value of $V_{tune}$ exceeds 1.1V. The PLL may be coupled to a calibration circuit (e.g., the calibration circuit 130 of FIG. 1 or the calibration circuit 240 of FIG. 2). When $V_{tune}$ exceeds a threshold value (e.g., 1.05V), the calibration circuit may slowly vary an output current coupled to a VCO of the PLL. Slowly varying the output current may result in a gradual decline in $V_{tune}$, as illustrated by a curve 404, returning $V_{tune}$ to an acceptable value below 1.1V (e.g., 0.65V). Moreover, an output frequency of the VCO may remain in lock throughout such calibration, as illustrated by a representative frequency response curve 402.

Figure 5:
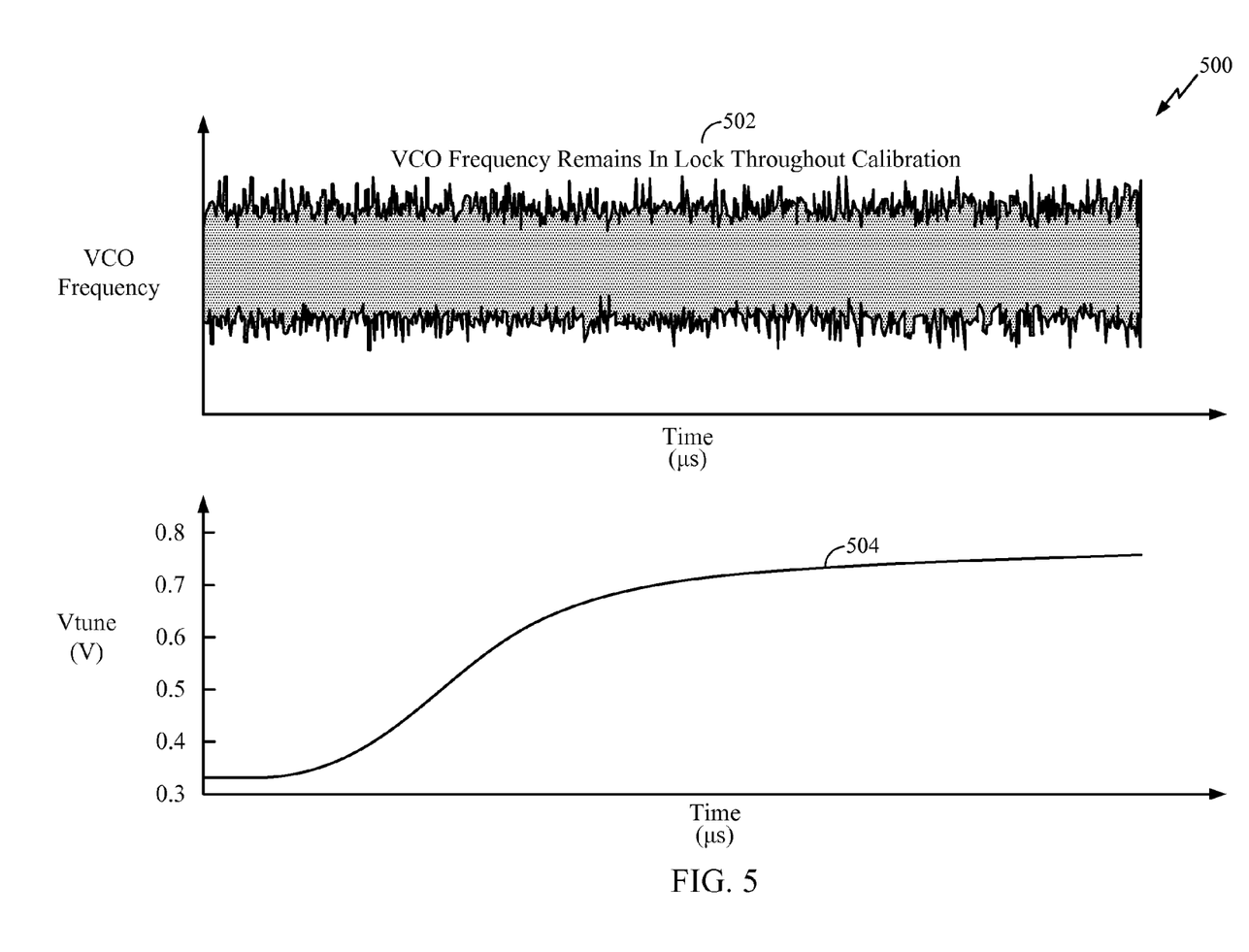
FIG. 5 is a diagram to illustrate a particular embodiment of increasing a tuning voltage of the PLL of FIG. 1 or of FIG. 2 without losing lock.

Referring to FIG. 5, a particular embodiment of increasing a tuning voltage of a PLL (e.g., the PLL 110 of FIG. 1 or the PLL 210 of FIG. 2) without losing lock is disclosed and generally designated 500.

For example, a charge pump of the PLL may produce a tuning signal $V_{tune}$, and the PLL may experience performance degradation when the value of $V_{tune}$ drops below 0.3V. The PLL may be coupled to a calibration circuit (e.g., the calibration circuit 130 of FIG. 1 or the calibration circuit 240 of FIG. 2). When $V_{tune}$ falls below a threshold value (e.g., 0.35V), the calibration circuit may slowly vary an output current coupled to a VCO of the PLL. Slowly varying the output current may result in a gradual increase in $V_{tune}$, as illustrated by a curve 504, returning $V_{tune}$ to an acceptable value above 0.3V (e.g., 0.75V). Moreover, an output frequency of the VCO may remain in lock throughout such calibration, as illustrated by a representative frequency response curve 502.

Figure 6:
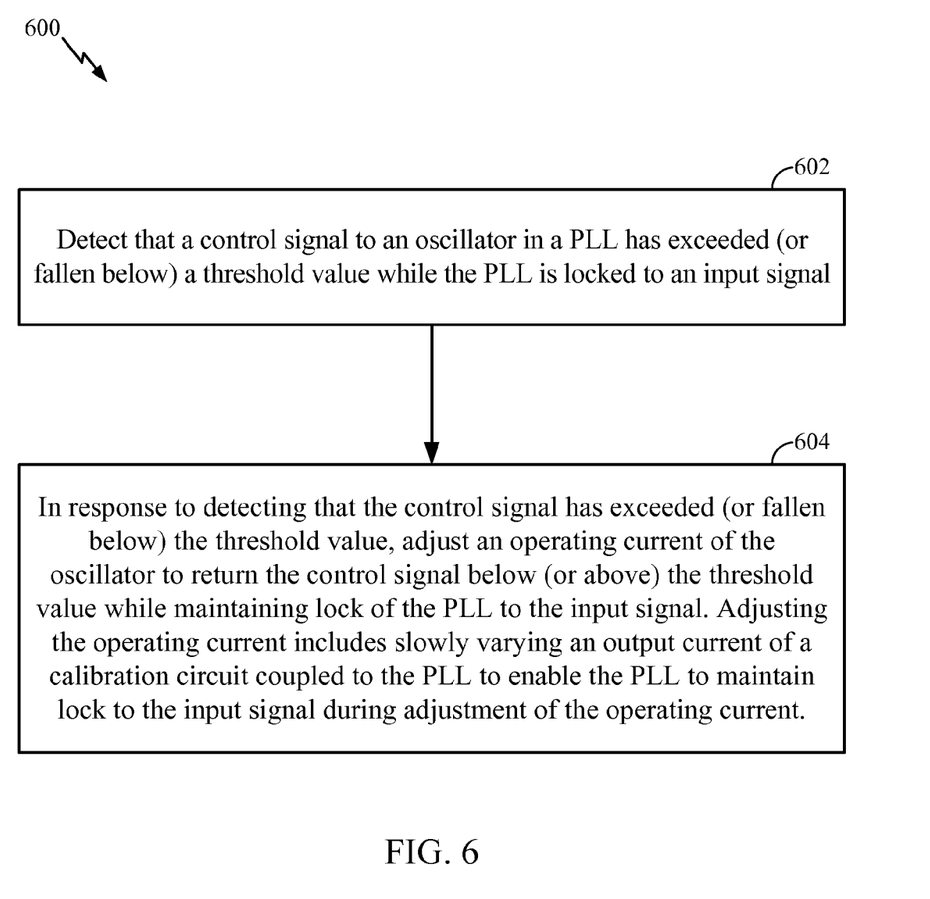
FIG. 6 is a flow chart of a particular illustrative embodiment of a method of calibrating a PLL while maintaining lock.

Referring to FIG. 6, a particular illustrative embodiment of a method of calibrating a PLL while maintaining lock is disclosed and generally designated 600. In an illustrative embodiment, the method 600 may be performed at the system 100 of FIG. 1 or the system 200 of FIG. 2.

The method 600 may include detecting that a control signal to an oscillator in a PLL has exceeded (or fallen below) a threshold value while the PLL is locked to an input signal, at 602. For example, in FIG. 1, the control signal testing circuit 120 may detect that $V_{tune}$ 122 has exceeded (or fallen below) a threshold value while the PLL 110 is locked to the input signal 102.

The method 600 may also include, in response to the detection, adjusting an operating current of the oscillator to return the control signal below (or above) the threshold value while maintaining lock of the PLL to the input signal, at 604. Adjusting the operating current may include slowly varying an output current of a calibration circuit coupled to the PLL to enable the PLL to maintain lock to the input signal during adjustment of the operating current. For example, in FIG. 1, the calibration circuit 130 may slowly vary the signal 132 applied to the oscillator 118 to return $V_{tune}$ 122 below (or above) the threshold value while maintaining lock at the PLL 110 to the input signal 102.

Figure 8:
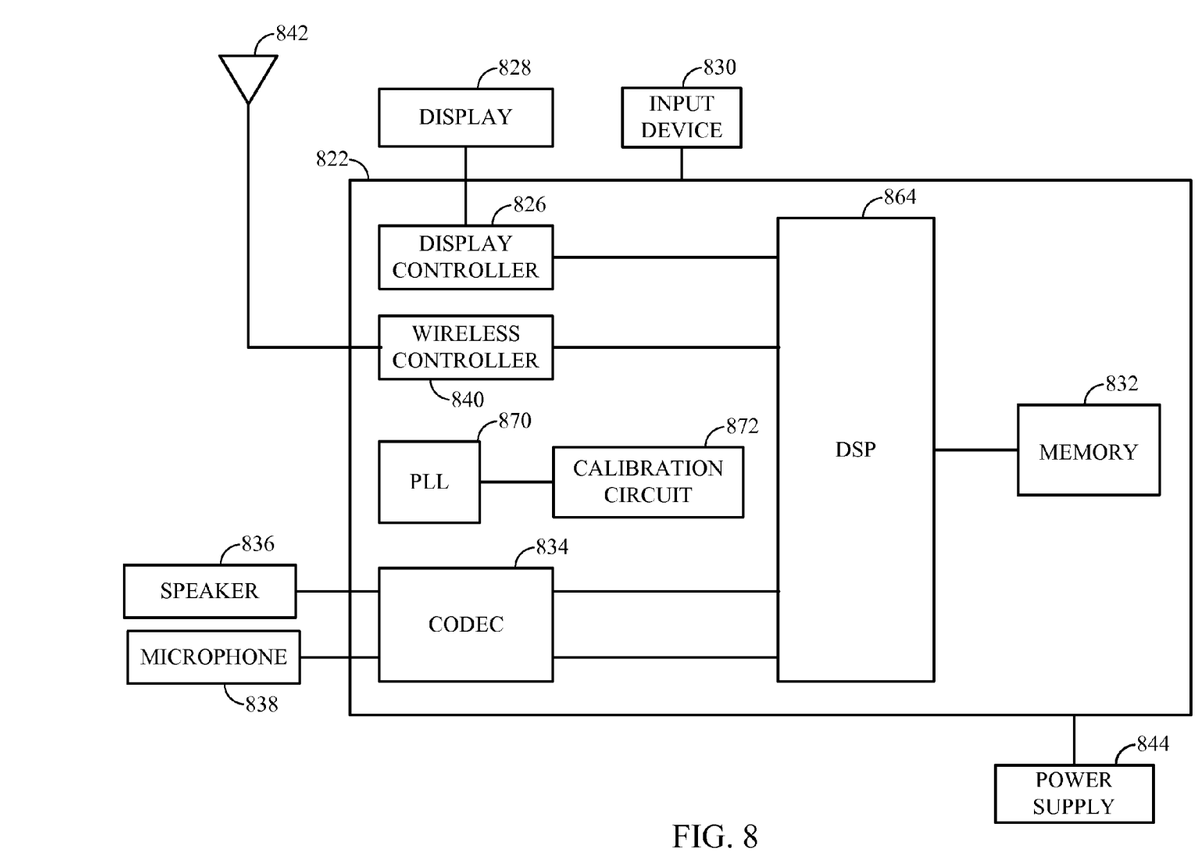
FIG. 8 is a block diagram of portable device including a system of calibrating a PLL while maintaining lock.
Figure 9:
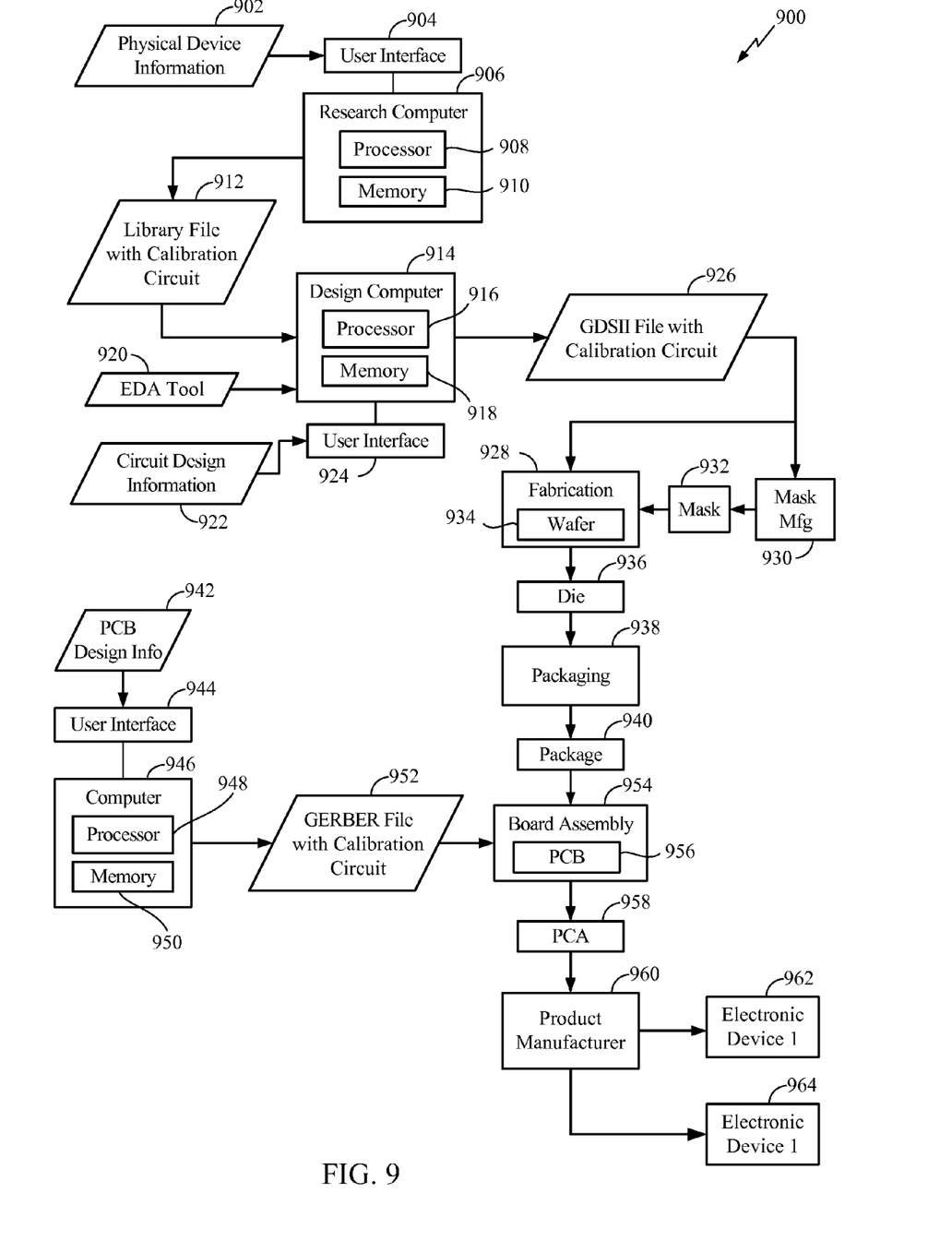
FIG. 9 is a data flow diagram of a particular illustrative embodiment of a manufacturing process to manufacture electronic devices that include a system of calibrating a PLL while maintaining lock.

In a particular embodiment, the method 600 of FIG. 6 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof As an example, the method 600 of FIG. 6 can be performed by a processor that executes instructions and that is integrated into an electronic device, as described with respect to FIGS. 8-9.

Figure 7:
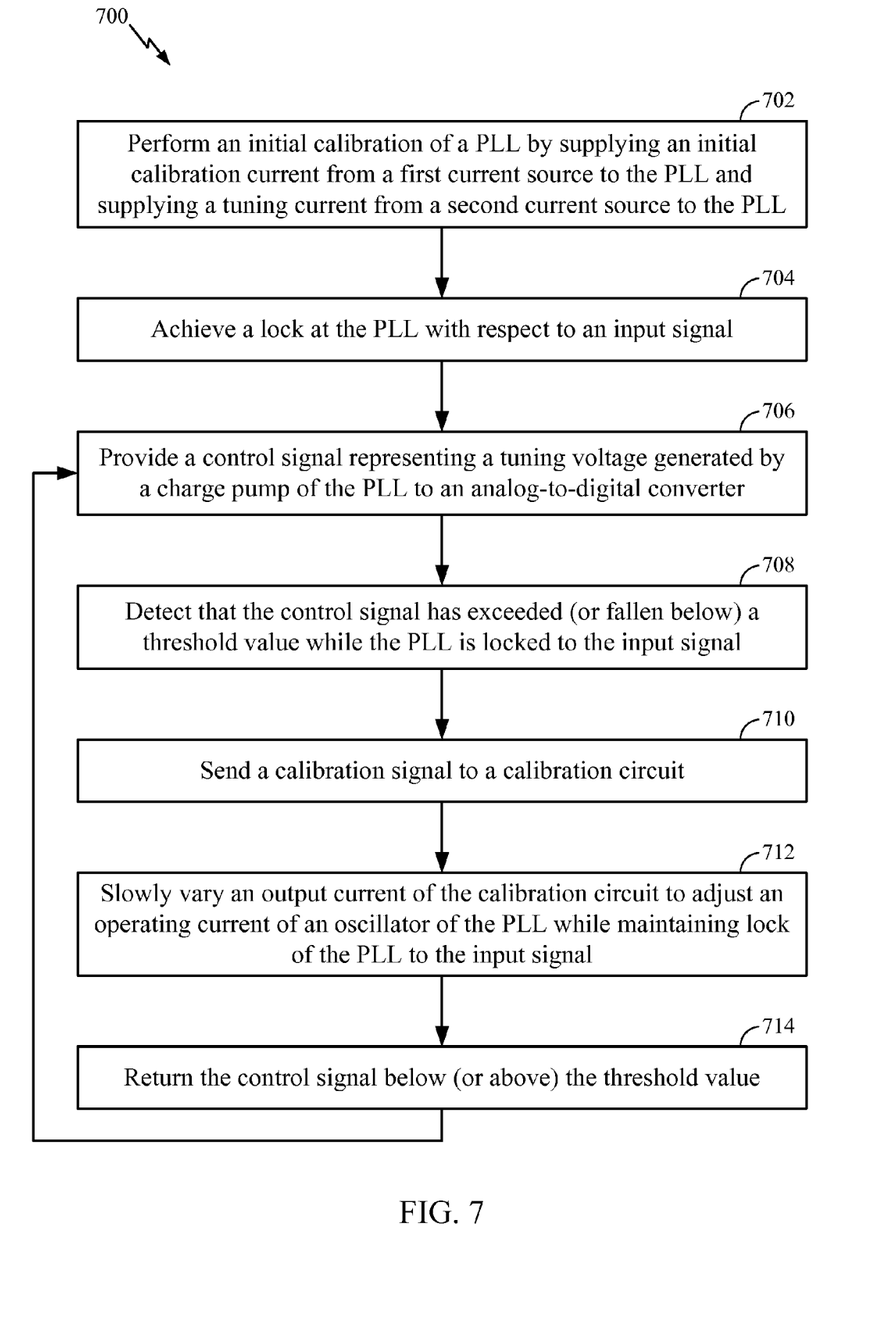
FIG. 7 is a flow chart of another particular illustrative embodiment of a method of calibrating a PLL while maintaining lock.

Referring to FIG. 7, another particular illustrative embodiment of a method of calibrating a PLL while maintaining lock is disclosed and generally designated 700. In an illustrative embodiment, the method 700 may be performed at the system 100 of FIG. 1 or the system 200 of FIG. 2.

The method 700 may include performing an initial calibration of a PLL by supplying an initial calibration current from a first current source to the PLL and supplying a tuning current from a second current source to the PLL, at 702. For example, in FIG. 2, the first current source 252 may supply the first current $I_{coarse}$ 262 to the PLL 210 and the second current source 254 may supply the second current $I_{fine}$ 264 to the PLL 210.

The method 700 may also include achieving a lock at the PLL with respect to an input signal, at 704. For example, in FIG. 2, the PLL 210 may achieve a lock between the output signal 204 and the input signal 202.

The method 700 may further include providing a control signal representing a tuning voltage to an analog-to-digital converter, at 706. The tuning voltage may be generated by a charge pump of the PLL. For example, in FIG. 2, the control signal $V_{tune}$ 222 may be provided from the charge pump 214 to the ADC 224.

The method 700 may include detecting that the control signal has exceeded (or fallen below) a threshold value while the PLL is locked to the input signal, at 708, and sending a calibration signal to a calibration circuit, at 710. For example, while the output signal 204 is locked to the input signal 202 in FIG. 2, the calibration and control logic 230 may detect that $V_{tune}$ 222 has exceeded (or fallen below) a threshold value. In response, the calibration and control logic 230 may transmit the calibration code 234 to the calibration circuit 240.

The method 700 may also include slowly varying an output current of the calibration circuit, at 712, and returning the control signal below (or above) the threshold value, at 714. Slowly varying the output current may adjust an operating current of an oscillator of the PLL while maintaining lock of the PLL to the input signal. For example, in FIG. 2, the calibration circuit 240 may slowly vary $I_{out}$ 266, which slowly varies the operating current $I_{total}$ 268 and returns $V_{tune}$ 222 below (or above) the threshold value while maintaining lock between the output signal 204 and the input signal 202.

In a particular embodiment, the method 700 of FIG. 7 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof As an example, the method 700 of FIG. 7 can be performed by a processor that executes instructions and that is integrated into an electronic device, as described with respect to FIGS. 8-9.

Referring to FIG. 8, a block diagram of a particular illustrative embodiment of a wireless communication device is depicted and generally designated 800. The device 800 includes a processor, such as a digital signal processor (DSP) 810, coupled to a memory 832. The device 800 may also include one or more phase-locked loops (PLLs) (e.g., an illustrative PLL 870) coupled to corresponding one or more calibration circuits (e.g., an illustrative calibration circuit 872). In an illustrative embodiment, the PLL 870 may correspond to the PLL 110 of FIG. 1 or the PLL 210 of FIG. 2, and the calibration circuit 872 may correspond to the calibration circuit 130 of FIG. 1, the calibration circuit 240 of FIG. 2, or the calibration circuit 300 of FIG. 3. In an illustrative embodiment, the PLL 870 and the calibration circuit 872 may operate according to the method 600 of FIG. 6, the method 700 of FIG. 7, or any combination thereof In a particular embodiment, the memory 832 may be a non-transitory computer-readable storage medium that stores instructions executable by a processor, such as the DSP 864, to perform the method 600 of FIG. 6, the method 700 of FIG. 7, or any combination thereof.

FIG. 8 also shows a display controller 826 that is coupled to the digital signal processor 810 and to a display 828. A coder/decoder (CODEC) 834 can also be coupled to the digital signal processor 810. A speaker 836 and a microphone 838 can be coupled to the CODEC 834. In a particular embodiment, the CODEC 834 or components thereof receive a control or timing signal from the PLL 870 coupled the calibration circuit 872.

FIG. 8 also indicates that a wireless controller 840 can be coupled to the digital signal processor 810 and to a wireless antenna 842. For example, the wireless controller 840 or components thereof may receive a control or timing signal from the PLL 870 coupled the calibration circuit 872. In a particular embodiment, the DSP 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the wireless antenna 842, and the power supply 844 are external to the system-on-chip device 822. However, each of the display 828, the input device 830, the speaker 836, the microphone 838, the wireless antenna 842, and the power supply 844 can be coupled to a component of the system-on-chip device 822, such as an interface or a controller.

In conjunction with the described embodiments, a system is disclosed that may include a PLL that includes an oscillator, means for calibrating the PLL (e.g., the calibration circuit 130 of FIG. 1, the calibration circuit 240 of FIG. 2, the calibration circuit 300 of FIG. 3, one or more other devices or circuits configured to calibrate the PLL, or any combination thereof The system may also include means for converting a control signal of the PLL to a corresponding digital value such as the control signal testing circuit 120 of FIG. 1, the ADC 224 of FIG. 2, one or more other devices or circuits configured to convert the control signal of the PLL to a digital value, or any combination thereof The system may further include means for sending a calibration signal to the means for calibrating such as the control signal testing circuit 120 of FIG. 1, the calibration and control logic 230 of FIG. 2, one or more other devices or circuits configured to send a calibration signal to the means for calibrating, or any combination thereof The system may include means for steering a feedback current such as the current steering circuit 350 of FIG. 3, one or more other devices or circuits configured to steer a feedback current, or any combination thereof For example, the feedback current may partially offset an input current received at a first gate of a first transistor based on a voltage difference across a resistive element coupled between the first gate of the first transistor and a second gate of a second transistor, as described with reference to FIG. 3.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 9 depicts a particular illustrative embodiment of an electronic device manufacturing process 900.

Physical device information 902 is received at the manufacturing process 900, such as at a research computer 906. The physical device information 902 may include design information representing at least one physical property of a semiconductor device, such as the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including a device that includes the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, of the library file 912. For example, a user of the design computer 914 may enter circuit design information 922 via a user interface 924 coupled to the design computer 914. The circuit design information 922 may include design information representing at least one physical property of a semiconductor device, such as PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, in addition to other circuits or information. To illustrate, the data file may include information corresponding to a system-on-chip (SOC) that includes the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, and that also includes additional electronic circuits and components within the SOC.

The GDSII file 926 may be received at a fabrication process 928 to manufacture the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a circuit including a device that includes the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer, into which the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these illustrated units. Embodiments of the disclosure may be suitably employed in any device which includes active integrated circuitry including memory and on-chip circuitry.

A device that includes the PLL 110 of FIG. 1, the control signal testing circuit 120 of FIG. 1, the calibration circuit 130 of FIG. 1, the PLL 210 of FIG. 2, the ADC 224 of FIG. 2, the calibration and control logic 230 of FIG. 2, the calibration circuit 240 of FIG. 2, the calibration circuit 300 of FIG. 3, or any combination thereof, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    detecting that a control signal to an oscillator in a phase-locked loop (PLL) has exceeded a threshold while the PLL is locked to an input signal, wherein detecting that the control signal has exceeded the threshold includes:
        providing the control signal to an analog-to-digital converter (ADC),
        converting the control signal to a digital value at the ADC, and
        comparing the digital value to the threshold;
    sending a calibration signal to a calibration circuit based on an output of the ADC; and
    in response to the detecting, adjusting an operating current of the oscillator to return the control signal below the threshold while maintaining lock of the PLL to the input signal, wherein adjusting the operating current includes slowly varying an output current of the calibration circuit coupled to the PLL to enable the PLL to maintain lock to the input signal during adjustment of the operating current, wherein adjusting the output of the calibration circuit includes adjusting an input current applied to a gate of a first transistor, wherein the gate of the first transistor is coupled to a gate of a second transistor via a resistive element, and wherein a current steering circuit generates a feedback current to partially offset the input current based on a voltage difference across the resistive element.

2. The method of claim 1, wherein the threshold comprises an upper threshold of the PLL or a lower threshold of the PLL.

3. The method of claim 1, further comprising performing an initial calibration of the PLL prior to attaining lock of the PLL to the input signal by sending an initial calibration signal to a first current source coupled to the PLL to set an initial calibration current of the PLL, wherein a second current source coupled to the PLL is responsive to the control signal to provide a tuning current, and wherein the initial calibration current enables the PLL to initially lock to the input signal at a value of the control signal that is below the threshold.

4. The method of claim 3, wherein the operating current comprises the initial calibration current, the tuning current, and the output current of the calibration circuit.

5. The method of claim 1, wherein the current steering circuit at least partially throttles a voltage applied at the gate of the second transistor.

6. The method of claim 5, wherein the current steering circuit comprises a first current source serially coupled to a second current source via a node, the first current source responsive to a first voltage at a first terminal of the resistive element to output a first current to the node and the second current source responsive to a second voltage at a second terminal of the resistive element to input a second current from the node, and wherein the feedback current comprises a difference between the first current and the second current.

7. The method of claim 1, wherein the detecting and the adjusting are performed at a processor integrated into an electronic device.

8. An apparatus comprising:
    a phase-locked loop (PLL) including an oscillator; and
    a calibration circuit configured to slowly vary an output current supplied to the PLL in response to a determination that a control signal to the oscillator has exceeded a threshold,
    wherein the calibration circuit comprises:
        a first transistor to receive an input current at a first gate;
        a second transistor having a second gate coupled to the first gate via a resistive element; and
        a current steering circuit to generate a feedback current to partially offset the input current based on a voltage difference across the resistive element,
    wherein slowly varying the output current adjusts an operating current of the oscillator to return the control signal below the threshold, and
    wherein slowly varying the output current enables the PLL to maintain lock to an input signal during adjustment of the operating current.

9. The apparatus of claim 8, further comprising an analog-to-digital converter (ADC) to receive the control signal.

10. The apparatus of claim 9, further comprising logic to send a calibration signal to the calibration circuit based on a digital output of the ADC.

11. The apparatus of claim 8, further comprising:
a first current source to supply an initial calibration current to the PLL prior to the lock of the PLL to the input signal; and
a second current source responsive to the control signal to provide a tuning current to the PLL,
wherein the operating current comprises the initial calibration current, the tuning current, and the output current supplied by the calibration circuit.

12. The apparatus of claim 8, wherein the current steering circuit comprises:
a first current source; and
a second current source serially coupled to the first current source via a node,
wherein the first current source is responsive to a first voltage at a first terminal of the resistive element to output a first current to the node,
wherein the second current source is responsive to a second voltage at a second terminal of the resistive element to input a second current from the node, and
wherein the feedback current comprises a difference between the first current and the second current.

13. The apparatus of claim 8, further comprising a capacitor coupled to the resistive element.

14. The apparatus of claim 8, integrated in at least one semiconductor die.

15. The apparatus of claim 8, further comprising a device selected from the group consisting of a set top box, a music player, a video player, an entertainment unit, a navigation device, a communications device, a personal digital assistant (PDA), a fixed location data unit, and a computer, into which the PLL is integrated.

16. An apparatus comprising:
a phase-locked loop (PLL) including an oscillator; and
means for calibrating the PLL by slowly varying an output current supplied to the PLL in response to a determination that a control signal to the oscillator has crossed a threshold,
wherein the means for calibrating comprises:
a first transistor to receive an input current at a first gate;
a second transistor having a second gate coupled to the first gate via a resistive element; and
means for steering a feedback current to partially offset the input current based on a voltage difference across the resistive element,
wherein slowly varying the output current adjusts an operating current of the oscillator, and
wherein slowly varying the output current enables the PLL to maintain lock to an input signal during adjustment of the operating current.

17. The apparatus of claim 16, further comprising means for converting the control signal to a corresponding digital value.

18. The apparatus of claim 17, further comprising means for sending a calibration signal to the means for calibrating based on an output of the means for converting.

19. The apparatus of claim 16, integrated in at least one semiconductor die.

20. The apparatus of claim 16, further comprising a device selected from the group consisting of a set top box, a music player, a video player, an entertainment unit, a navigation device, a communications device, a personal digital assistant (PDA), a fixed location data unit, and a computer, into which the means for calibrating is integrated.

* * * * *